United States Patent
Shi et al.

(10) Patent No.: US 7,123,506 B2
(45) Date of Patent: Oct. 17, 2006

(54) METHOD AND SYSTEM FOR PERFORMING MORE CONSISTENT SWITCHING OF MAGNETIC ELEMENTS IN A MAGNETIC MEMORY

(75) Inventors: Xizeng Shi, Fremont, CA (US); Son Le, Gilroy, CA (US); Po-Kang Wang, San Jose, CA (US); Tai Min, San Jose, CA (US)

(73) Assignees: Applied Spintronics Technology, Inc., Milpitas, CA (US); Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 10/860,902

(22) Filed: Jun. 3, 2004

(65) Prior Publication Data

US 2005/0180201 A1 Aug. 18, 2005

Related U.S. Application Data

(60) Provisional application No. 60/544,152, filed on Feb. 13, 2004.

(51) Int. Cl.
*G11C 11/00* (2006.01)

(52) U.S. Cl. .................................... 365/158; 365/171

(58) Field of Classification Search ............... 365/158, 365/171
See application file for complete search history.

(56) References Cited

U.S. PATENT DOCUMENTS

| 6,490,217 B1* | 12/2002 | DeBrosse et al. ........ 365/225.5 |
| 6,674,663 B1* | 1/2004 | Okazawa et al. ........... 365/158 |
| 6,798,690 B1* | 9/2004 | Katti ........................ 365/158 |
| 6,839,270 B1* | 1/2005 | Perner et al. ............... 365/158 |
| 6,862,210 B1* | 3/2005 | Tsuchida et al. ............ 365/158 |
| 6,865,103 B1* | 3/2005 | Hidaka ..................... 365/158 |
| 6,876,575 B1* | 4/2005 | Hidaka ..................... 701/207 |
| 6,885,577 B1* | 4/2005 | Tang et al. ................... 702/7 |

* cited by examiner

*Primary Examiner*—Michael Tran
(74) *Attorney, Agent, or Firm*—Sawyer Law Group LLP (57) ABSTRACT

A method and system for programming a magnetic memory is disclosed. The method and system further include turning on a word line current and turning on a bit line current. The word line current is for generating at least one hard axis field. The bit line current is for generating at least one easy axis field. In one aspect, the method and system further include turning off the word line current and the bit line current such that a state of the at least one magnetic memory cell is repeatably obtained. In another aspect, the word line current is turned off after the bit line current is turned off.

12 Claims, 7 Drawing Sheets

METHOD AND SYSTEM FOR PERFORMING MORE CONSISTENT SWITCHING OF MAGNETIC ELEMENTS IN A MAGNETIC MEMORY

CROSS-REFERENCE TO RELATED APPLICATION

This application is claiming under 35 USC 119(e) the benefit of provisional patent application Ser. No. 60/544,152 filed on Feb. 13, 2004.

FIELD OF THE INVENTION

The present invention pertains to reading nonvolatile magnetic memories, such as a magnetic random access memory (MRAM), and more particularly to a method and system for providing a more reliable switching of magnetic elements in the magnetic memories.

BACKGROUND OF THE INVENTION

Figure 1A:
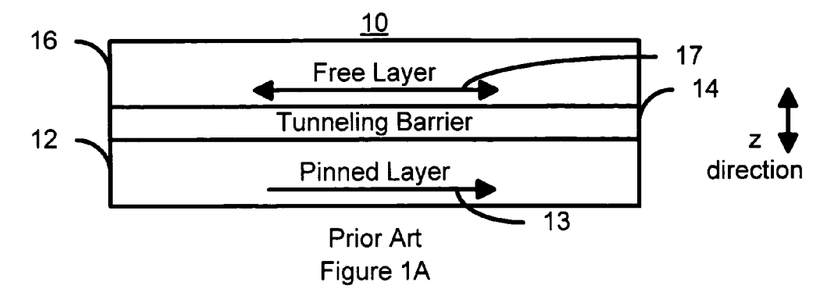
FIG. 1A is a diagram of a conventional magnetic element used in a magnetic memory.

FIG. 1 depicts a conventional magnetic element 10 used in conventional magnetic memories, such as magnetic random access memories (MRAM). The conventional magnetic element 10 includes a conventional pinned layer 12, a conventional tunneling barrier 14, and a conventional free layer 16. Other layers (not shown), such as antiferromagnetic pinning, seed, and/or capping layers may also be used. The conventional pinned layer 12 and the conventional free layer 18 are ferromagnetic. Thus, the conventional free layer 16 is depicted as having a changeable magnetization 17. The conventional spacer layer 14 is a nonmagnetic tunneling barrier layer. The magnetization 13 of the pinned layer 12 is pinned in a particular direction. The magnetization 17 of the free layer 16 is free to rotate, typically in response to an external magnetic field.

The geometry of the conventional magnetic element 10 is such that the magnetization 17 of the conventional free layer 16 is stable parallel or antiparallel to the magnetization 13 of the conventional pinned layer 12. Depending upon the orientations of the magnetization 17 of the conventional free layer 16 and the magnetization 13 of the conventional pinned layer 12, the resistance of the conventional magnetic element 10 changes. When the magnetization 17 of the conventional free layer 16 is parallel to the magnetization 13 of the conventional pinned layer 12, the resistance of the conventional magnetic element 10 is low and, in general, the magnetic element 10 is in a "0" state. When the magnetization 17 of the conventional free layer 16 is antiparallel to the magnetization 13 of the conventional pinned layer 12, the resistance of the conventional magnetic element 10 is high and the conventional magnetic element 10 is in a "1" state.

In order to write to the conventional magnetic element 10, two currents, or equivalently, two fields are typically used. One field is typically perpendicular to the final, equilibrium direction of the magnetization 17 of the conventional free layer 16. This field is known as the hard axis field and is typically generated by a word line current driven in a corresponding word line. The other field is typically parallel or antiparallel to the magnetization 13 of the conventional pinned layer 12. This field is known as the easy axis field and is typically generated by a bit line current driven in a corresponding bit line. Depending on the direction of the bit line current (e.g. positive or negative with respect to a particular defined current direction), the magnetization 17 of the conventional free layer 16 is aligned generally parallel or generally antiparallel to the magnetization 13 of the conventional pinned layer 12.

Figure 1B:
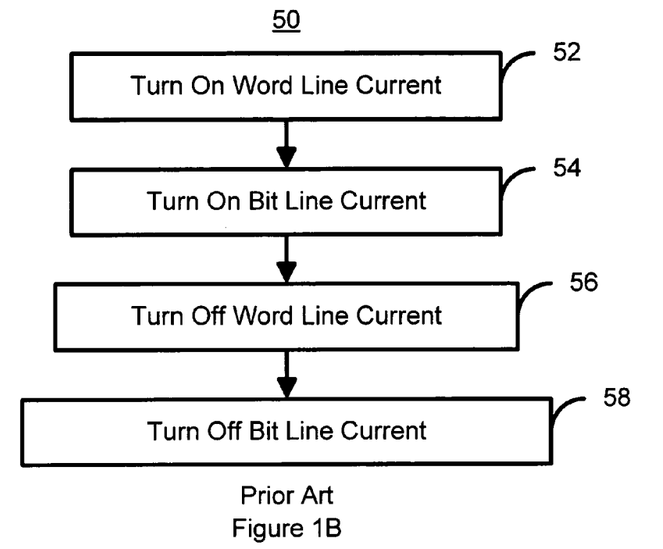
FIG. 1B is a flow chart depicting a conventional method for programming a conventional magnetic storage cell in a conventional magnetic memory.
Figure 1C:
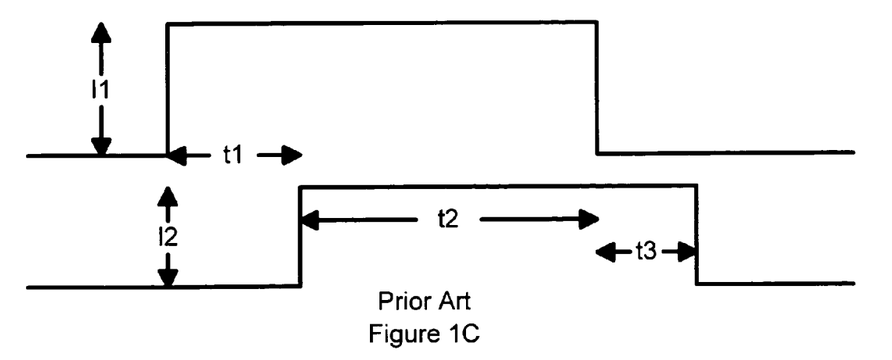
FIG. 1C is a graph depicting the hard axis and easy axis currents versus time for programming of a conventional magnetic storage cell in a conventional magnetic memory.

FIG. 1B depicts a conventional method 50 for programming the conventional magnetic element 10. FIG. 1C depicts a graph indicating the word line current and bit line current corresponding to the conventional method 50. At some time, the word line current I1 is turned on, via step 52. Consequently, a hard axis field corresponding to I1 is generated. After some later time, t1, the bit line current I2 (or −I2) is turned on, via step 54. Thus, an easy axis field in the appropriate direction is generated. Both currents remain on for some time, t2. The word line current is then turned off, via step 56. After some time, t3, after the word line current has been completely turned off, the bit line current is turned off, via step 58.

Figure 2A:
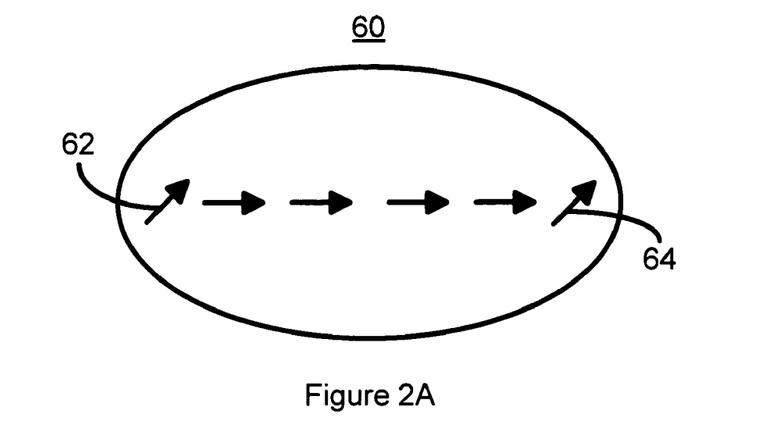
FIG. 2A depicts one possible magnetization distribution for the conventional free layer of one conventional magnetic element programmed using a conventional method.
Figure 2B:
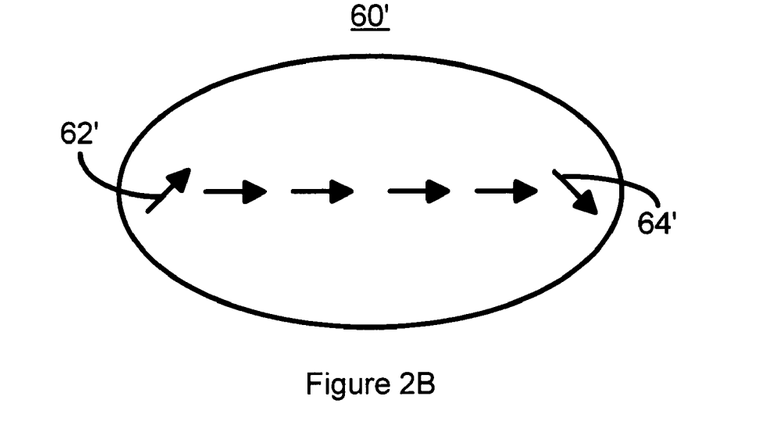
FIG. 2B depicts another possible magnetization distribution for the conventional free layer of one conventional magnetic element programmed using a conventional method.
Figure 2C:
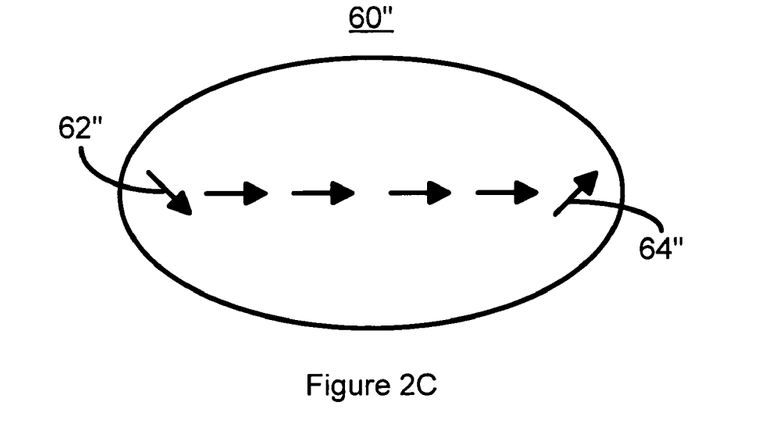
FIG. 2C depicts a third possible magnetization distribution for the conventional free layer of one conventional magnetic element programmed using a conventional method.

Although the conventional method 50 allows the conventional magnetic element 10 to be programmed, one of ordinary skill in the art will readily realize that there are drawbacks to such programming. FIGS. 2A–2C depict the free layer 60, 60' and 60" of the conventional magnetic element 10 after the conventional method 50 has been used. The same currents were used in steps 52 and 54 for the free layer 60, 60' and 60". As can be seen in FIGS. 2A–2C, the majority of the magnetic moments for each of the free layers 60, 60' and 60" are aligned in the same direction. However, due to the demagnetization field at the ends of the free layers 60, 60', and 60", the magnetization near the left and right ends of the free layers 60, 60', and 60", respectively, are not perpendicular to the surfaces at the ends of the free layers 60, 60', and 60", respectively. Instead, the magnetic moments 62 and 64, 62' and 64', and 62" and 64" may have different orientations. The free layer 60 has the magnetic moments 62 and 64 parallel. The magnetic moments 62' and 64' of the free layer 60' are not parallel. Although the magnetic moment 62' is in the same direction as the magnetic moment 62, the magnetic moment 64' is in a different direction. Similarly, the magnetic moments 62" and 64" of the free layer 60" are not parallel. Although the magnetic moment 64' is in the same direction as the magnetic moment 64, the magnetic moment 62" is in a different direction.

The differences in the magnetic moments 62 and 64, 62' and 64', and 62" and 64" cause the free layers 60, 60', and 60", respectively, to be switched at different fields and, therefore, programming failures. Stated differently, even when programmed in the same way using the conventional method 50, the magnetic moments 62 and 64, 62' and 64', and 62" and 64" may differ. Consequently, the fields required to switch the magnetizations may differ. As a result, the bit line currents and word line currents required to program the free layers 60, 60', and 60" differ. When the switching field increases, the currents actually used may not be sufficient to program the free layer 60, 60', or 60". Conversely, when the switching field decreases, the currents actually used may cause inadvertent programming of the free layer 60, 60', or 60".

Accordingly, what is needed is a system and method for more reliably programming elements in a magnetic memory. The present invention addresses such a need.

SUMMARY OF THE INVENTION

The present invention provides a method and system for programming a magnetic memory. The method and system further include turning on a word line current and turning on a bit line current. The word line current is for generating at least one hard axis field. The bit line current is for generating at least one easy axis field. In one aspect, the method and system further include turning off the word line current and the bit line current such that a state of the at least one magnetic memory cell is repeatably obtained. In another aspect, the word line current is turned off after the bit line current is turned off. According to the system and method disclosed herein, the present invention provides a method that allows repeatable programming of magnetic memories such that inadvertent programming and programming failures are reduced or eliminated.

DETAILED DESCRIPTION OF THE INVENTION

The present invention relates to an improvement in programming of magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for programming a magnetic memory. The method and system further include turning on a word line current and turning on a bit line current. The word line current is for generating at least one hard axis field. The bit line current is for generating at least one easy axis field. The method and system further include turning off the word line current and the bit line current such that a state of the at least one magnetic memory cell is repeatably obtained.

The present invention will be described in terms of a particular magnetic element. However, one of ordinary skill in the art will readily recognize that this method and system will operate effectively for other magnetic elements, including but not limited to spin valves. The present invention is also described in the context of particular methods having certain steps. However, one of ordinary skill in the art will readily recognize that the method may include other and/or additional steps not inconsistent with the present invention. Moreover, the present invention is described in terms of word lines and bit lines. However, one of ordinary skill in the art will readily recognize that these names may be interchanged.

Figure 3:
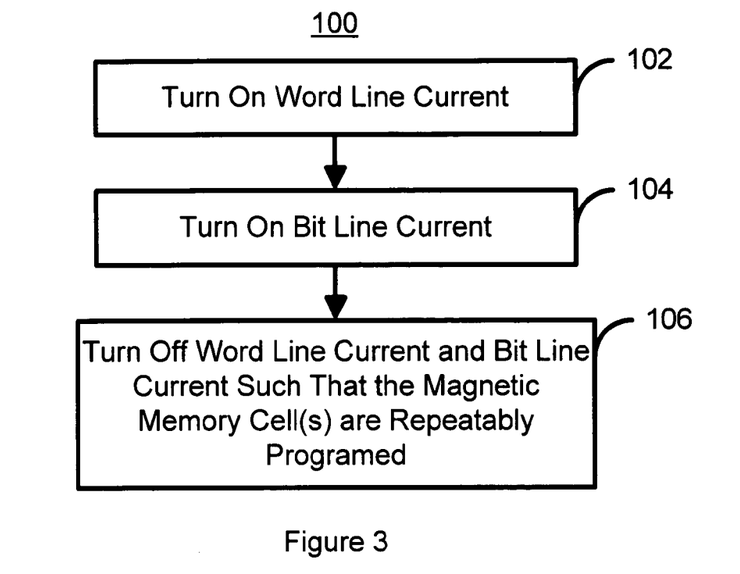
FIG. 3 is a high-level flow chart depicting one embodiment of a method in accordance with the present invention for more consistently programming a magnetic storage cell in a magnetic memory.

To more particularly illustrate the method and system in accordance with the present invention, refer now to FIG. 3, depicting a high-level flow chart of one embodiment of a method 100 in accordance with the present invention for more consistently programming a magnetic storage cell in a magnetic memory. The method 100 is described in the context of programming a single memory cell. However, one of ordinary skill in the art will readily recognize that the method can be used for multiple memory cells, for example by utilizing a multiple bit line currents. A word line current is turned on, via step 102. The word line current generates the hard axis field used in programming a memory cell. The appropriate bit line current is turned on, via step 104. Preferably step 104 turns the bit line current on after the word line current has been turned on. The bit line current generates the easy axis field. Thus, the sign of the bit line current (positive or negative) sets the direction of the easy axis field and, therefore, the state of the magnetic memory cell. The word line current and the bit line current are turned off such that a state of the at least one magnetic memory cell is repeatably obtained, via step 106. As defined herein a state of a magnetic memory cell is repeatably obtained when the magnetic moments, including magnetic moments at the ends of the magnetic memory cell, are in substantially the same direction when a particular state (e.g. a "0" or "1") is programmed to the magnetic memory cell. Step 106 preferably occurs after a desired time interval has passed since the bit line current was turned on. In addition, step 106 preferably turns the word line current and the bit line current off such that the word line current reaches zero after the bit line current reaches zero.

The method 100 allows for more repeatable programming of magnetic memory cells. Because step 106 turns the word line current and bit line current off such that a state of the magnetic memory cell is repeatably obtained (or turns the word line current off after the bit line current has been turned off), inadvertent writing and programming failures may be reduced or eliminated. In particular, the magnetic moments within the magnetic memory cell, including those at the edges of the magnetic memory cell, are substantially the same for a particular state of the magnetic memory cell. In a preferred embodiment, the word line current and, therefore, the hard axis field are turned off after the bit line current and easy axis field. As a result, the magnetic moments at the edges of the memory cell will be substantially the same for a particular state of the magnetic memory cell. For example, the free layer 60 depicted in FIG. 2A may be repeatably obtained. In other words, the moments 62 and 64 will be in substantially the direction shown in FIG. 2A. The configurations depicted in FIGS. 2B and 2C may generally be avoided. Thus, the field at which the magnetic memory cell will switch is substantially the same. Consequently, the hard and easy axis fields, and the corresponding currents, required to program the memory cell will be substantially the same. The state and, therefore, programming of the magnetic memory cell can thus be repeatably obtained.

Figure 4A:
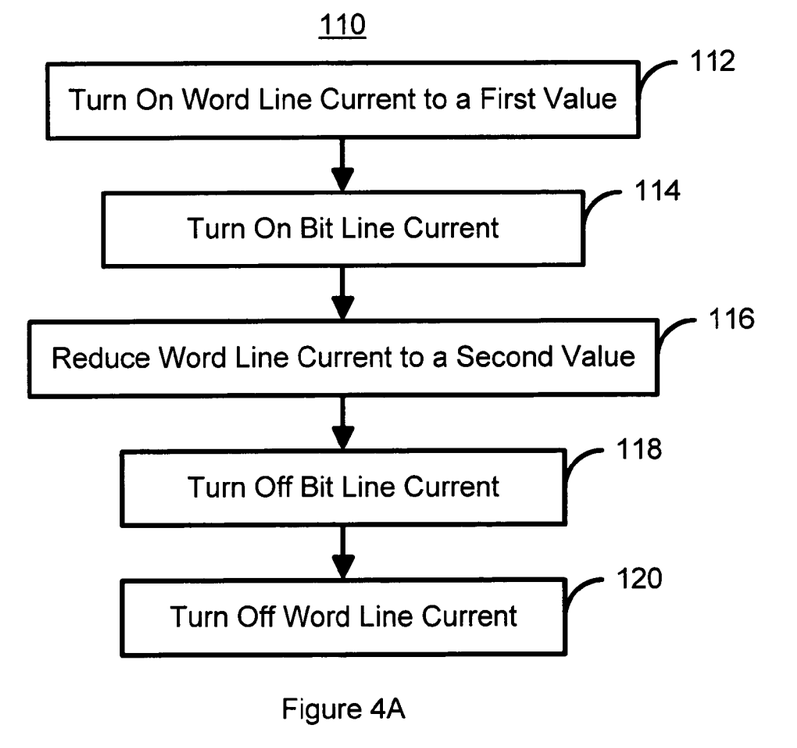
FIG. 4A is a more detailed flow chart depicting a first embodiment of a method in accordance with the present invention for more consistently programming a magnetic storage cell in a magnetic memory.

FIG. 4A is a more detailed flow chart depicting a first embodiment of a method 110 in accordance with the present invention for more consistently programming a magnetic storage cell in a magnetic memory. The method 110 is described in the context of programming a single memory cell. However, one of ordinary skill in the art will readily recognize that the method can be used for multiple memory cells, for example by utilizing a multiple bit line currents. A word line current is turned on to a first value, via step 112. The word line current generates the hard axis field used in programming a memory cell. The appropriate bit line current is turned on, via step 114. Preferably step 114 turns the bit line current on after the word line current has been turned on. The bit line current generates the easy axis field. Thus, the sign of the bit line current (positive or negative) sets the direction of the easy axis field and, therefore, the state of the magnetic memory cell. The word line current is reduced to a second value that is less than the first value, via step 116. Step 116 preferably occurs after a desired time interval has passed since the bit line current was turned on. The bit line current is turned off, via step 118. After the bit line current has been turned off, the word line current is turned, via step 120.

Figure 4B:
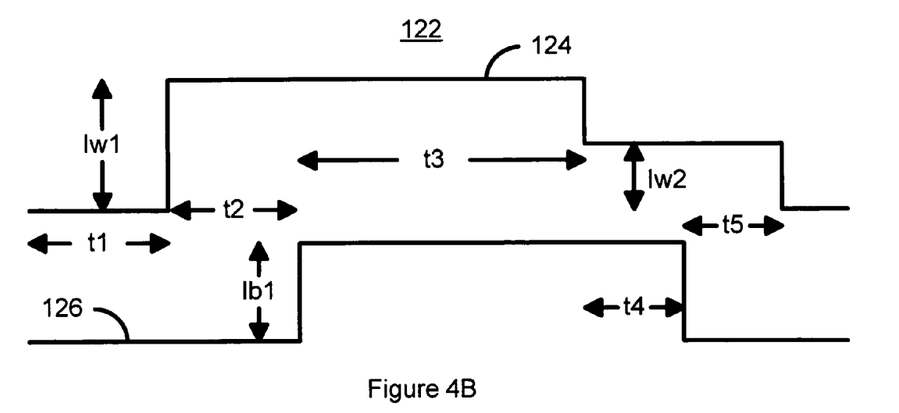
FIG. 4B is a graph depicting the word line and bit line currents versus time for programming of a magnetic storage cell in a magnetic memory using the first embodiment of the method in accordance with the present invention.
Figure 4C:
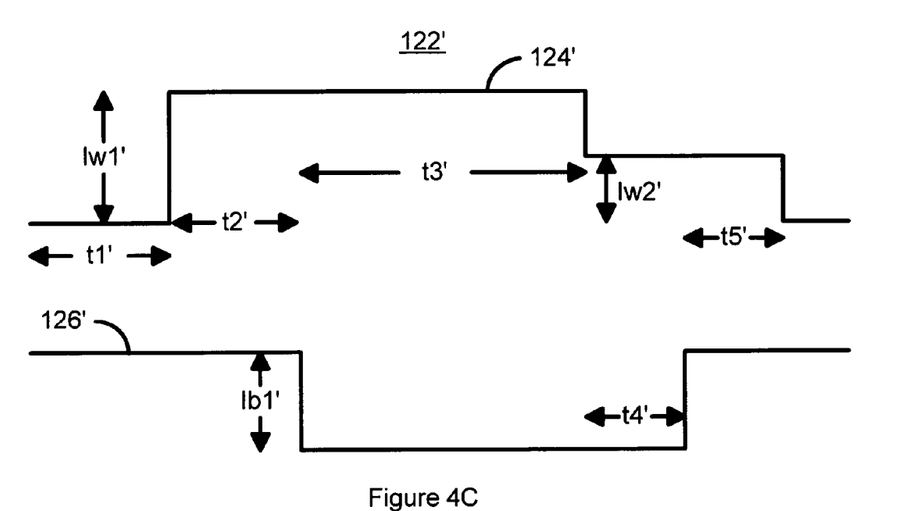
FIG. 4C is another graph depicting the word line and bit line currents versus time for programming of a magnetic storage cell in a magnetic memory using the first embodiment of the method in accordance with the present invention.

FIG. 4B is a graph 122 depicting the word line current 124 and bit line current 126 versus time for programming of a magnetic storage cell in a magnetic memory using the first embodiment of the method 110 in accordance with the present invention. FIG. 4C is a graph 122' depicting the word line current 124' and bit line current 126' versus time for programming of a magnetic storage cell in a magnetic memory using the first embodiment of the method in accordance with the present invention. Referring to FIGS. 4B and 4C, note that the bit line current 126' is negative, while the bit line current 126 is positive. Thus, the bit line currents 126 and 126' are simply used to program the memory cell, such as one including the conventional magnetic element 10, to different states. Also in a preferred embodiment, Iw1 equals Iw1', Ib1 equals Ib1', t1 equals=t1', t2 equals t2', t3 equals t3', t4 equals t4', and t5 equals t5'. As can be seen in FIGS. 4B and 4C, the word line current 124/124' is turned on to a value Iw1/Iw1', respectively, at a time t1/t1', respectively. An amount of time later, t2/t2', the bit line current 126/126', respectively, is turned on to Ib1/Ib1'. At an amount of time, t3/t3', later the word line current 124/124', respectively, is reduced to a lower value, Iw2/Iw2', respectively. The bit line current 126/126' is turned off at an amount of time t4/t4', respectively, later. Finally, the word line current 124/124' is turned off an amount of time, t5/t5' later.

Because the word line current 124/124' is turned off after the bit line current 126/126' in step 120, the method 110 allows for more repeatable programming of magnetic memory cells. The word line current and, therefore, the hard axis field are turned off after the bit line current and easy axis field. As a result, the magnetic moments at the edges of the memory cell will be substantially the same for a particular state of the magnetic memory cell. For example, the free layer 60 depicted in FIG. 2A may be repeatably obtained. In other words, the moments 62 and 64 will be in substantially the direction shown in FIG. 2A. The remaining configurations depicted in FIGS. 2B and 2C may generally be avoided. Thus, the field at which the magnetic memory cell will switch is substantially the same. Consequently, the hard and easy axis fields, and the corresponding currents, required to program the memory cell will be substantially the same. The state and, therefore, programming of the magnetic memory cell can thus be repeatably obtained.

Figure 5A:
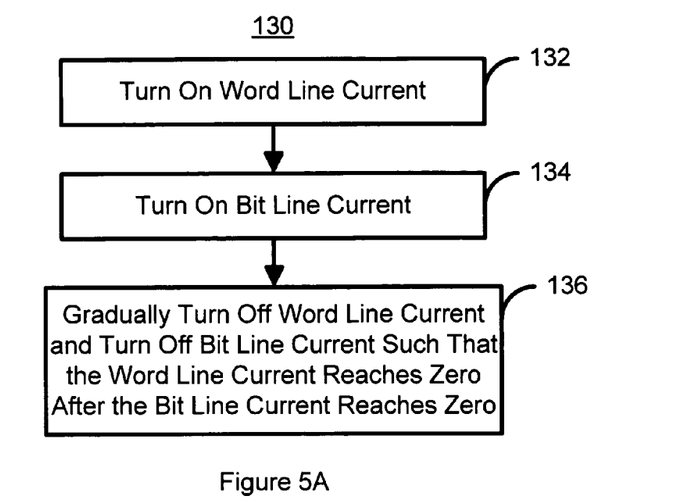
FIG. 5A is a more detailed flow chart depicting a second embodiment of a method in accordance with the present invention for more consistently programming a magnetic storage cell in a magnetic memory.

FIG. 5A is a more detailed flow chart depicting a second embodiment 130 of a method in accordance with the present invention for more consistently programming a magnetic storage cell in a magnetic memory. The method 130 is described in the context of programming a single memory cell. However, one of ordinary skill in the art will readily recognize that the method can be used for multiple memory cells, for example by utilizing a multiple bit line currents. A word line current is turned on, via step 132. The word line current generates the hard axis field used in programming a memory cell. The appropriate bit line current is turned on, via step 134. Preferably step 134 turns the bit line current on after the word line current has been turned on. The bit line current generates the easy axis field. Thus, the sign of the bit line current (positive or negative) sets the direction of the easy axis field and, therefore, the state of the magnetic memory cell. The word line current is gradually reduced and the bit line current turned off such that the word line current is turned off (reaches zero) after the bit line current reaches zero, via step 136. Step 136 preferably commences occurs after a desired time interval has passed since the bit line current was turned on. Also in a preferred embodiment, the word line current is decreased in a linear fashion.

Figure 5B:
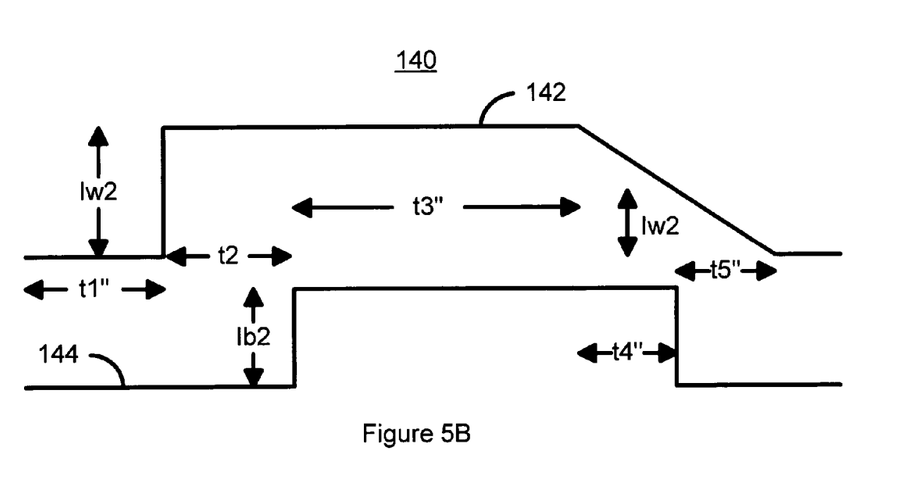
FIG. 5B is a graph depicting the word line and bit line currents versus time for programming of a magnetic storage cell in a magnetic memory using the second embodiment of the method in accordance with the present invention.

FIG. 5B is a graph 140 depicting the word line current 142 and bit line current 144 versus time for programming of a magnetic storage cell in a magnetic memory using the second embodiment of the method 130 in accordance with the present invention. The word line current 142 is turned on to a value of Iw3 at time t1". At time t2" later, the bit line current 144 is turned on to a value of Ib2. At a time, t3", later the gradual reduction of the word line current 142 is commenced to reduce the word line current 142 from Iw3 to zero. In the graph 140 depicted, the word line current is reduced in a linear fashion. The bit line current 144 is turned off at time t4" later, before the word line current 142 has reached zero. At a time, t5", later the word line current 142 reaches zero.

Because the word line current 142 is turned off after the bit line current 144 in step 136, the method 130 allows for more repeatable programming of magnetic memory cells. The word line current and, therefore, the hard axis field are turned off after the bit line current and easy axis field. As a result, the magnetic moments at the edges of the memory cell will be substantially the same for a particular state of the magnetic memory cell. For example, the free layer 60 depicted in FIG. 2A may be repeatably obtained. In other words, the moments 62 and 64 will be in substantially the direction shown in FIG. 2A. The remaining configurations depicted in FIGS. 2B and 2C may generally be avoided. Thus, the field at which the magnetic memory cell will switch is substantially the same. Consequently, the hard and easy axis fields, and the corresponding currents, required to program the memory cell will be substantially the same. The state and, therefore, programming of the magnetic memory cell can thus be repeatably obtained.

Figure 6A:
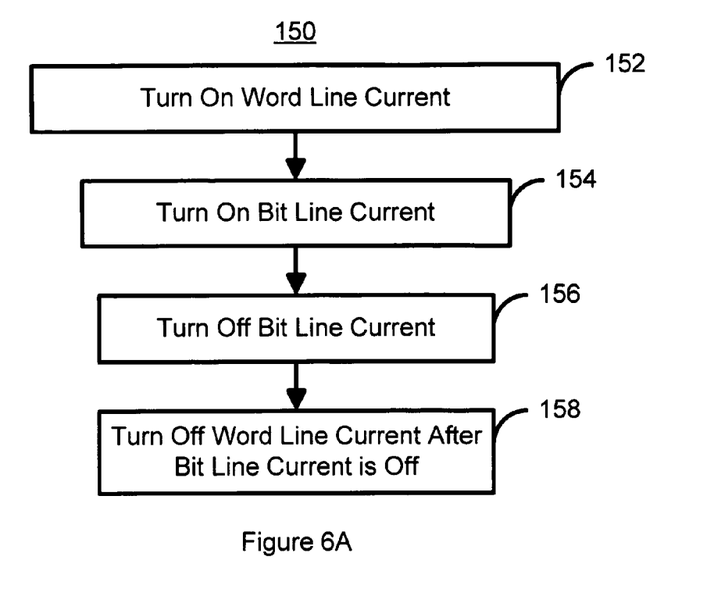
FIG. 6A is a more detailed flow chart depicting a third embodiment of a method in accordance with the present invention for more consistently programming a magnetic storage cell in a magnetic memory.

FIG. 6A is a more detailed flow chart depicting a third embodiment of a method in accordance with the present invention for more consistently programming a magnetic storage cell in a magnetic memory. The method 150 is described in the context of programming a single memory cell. However, one of ordinary skill in the art will readily recognize that the method can be used for multiple memory cells, for example by utilizing a multiple bit line currents. A word line current is turned on, via step 152. The word line current generates the hard axis field used in programming a memory cell. The appropriate bit line current is turned on, via step 154. Preferably step 154 turns the bit line current on after the word line current has been turned on. The bit line current generates the easy axis field. Thus, the sign of the bit line current (positive or negative) sets the direction of the easy axis field and, therefore, the state of the magnetic memory cell. The bit line current is turned off, via step 156. Step 156 preferably occurs after a desired time interval has passed since the bit line current was turned on. At a later time, the word line current is turned off, via step 158.

Figure 6B:
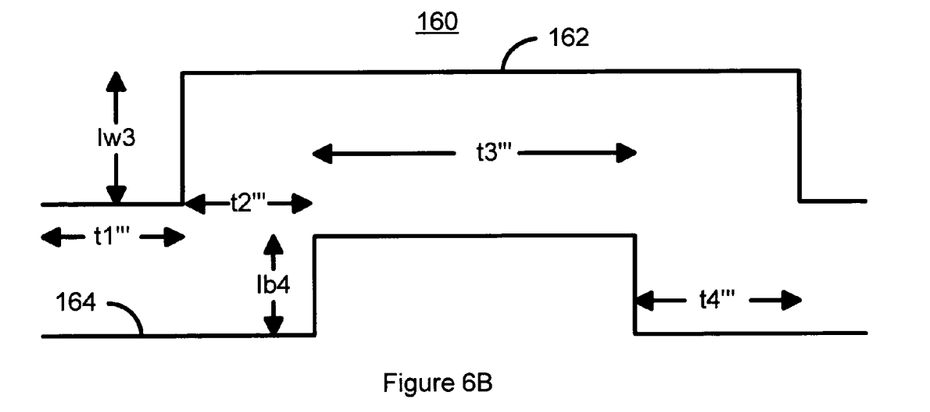
FIG. 6B is a graph depicting the word line and bit line currents versus time for programming of a magnetic storage cell in a magnetic memory using the third embodiment of the method in accordance with the present invention.

FIG. 6B is a graph 160 depicting the word line current 162 and bit line current 164 versus time for programming of a magnetic storage cell in a magnetic memory using the third embodiment of the method in accordance with the present invention. The word line current 162 is turned on to a value of Iw3 at time t1'". The bit line current 164 is turned on at a time t2'" later to a value of Ib4. At a time, t3'", later, the bit line current 164 is turned off. After the bit line current 164 is off, the word line current 162 is turned off, at time t4'" later.

Because the word line current 162 is turned off after the bit line current 164, the method 150 allows for more repeatable programming of magnetic memory cells. The word line current and, therefore, the hard axis field are turned off after the bit line current and easy axis field. As a result, the magnetic moments at the edges of the memory cell will be substantially the same for a particular state of the magnetic memory cell. For example, the free layer 60 depicted in FIG. 2A may be repeatably obtained. In other words, the moments 62 and 64 will be in substantially the direction shown in FIG. 2A. The remaining configurations depicted in FIGS. 2B and 2C may generally be avoided. Thus, the field at which the magnetic memory cell will switch is substantially the same. Consequently, the hard and easy axis fields, and the corresponding currents, required to program the memory cell will be substantially the same. The state and, therefore, programming of the magnetic memory cell can thus be repeatably obtained.

Figure 7A:
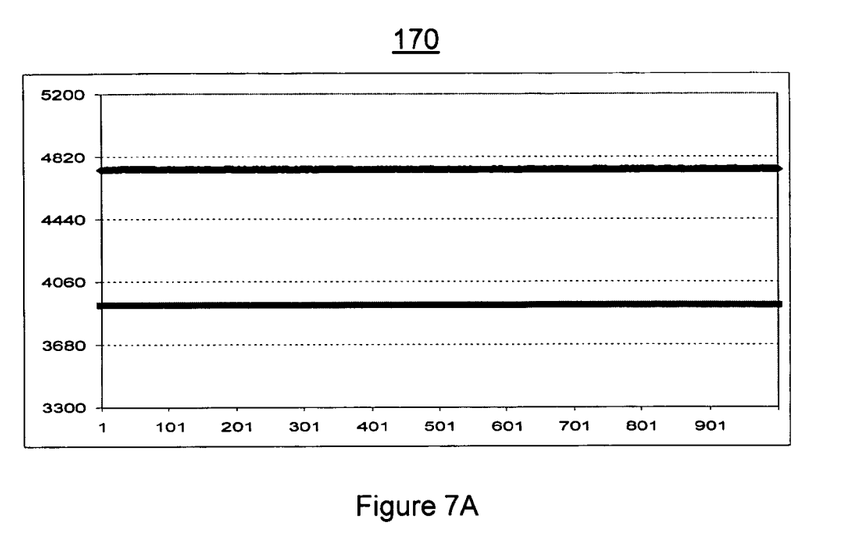
FIG. 7A is a graph depicting a write-read test using one embodiment of the method in accordance with the present invention for programming a magnetic memory.
Figure 7B:
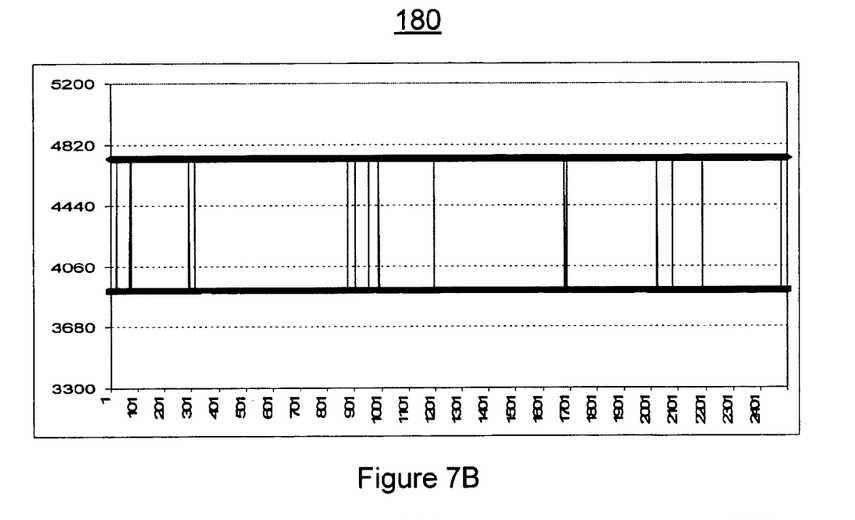
FIG. 7B is a graph depicting a write-read test using a conventional method for programming a magnetic memory.

FIG. 7A is a graph 170 depicting a write-read test using one embodiment of the method in accordance with the present invention for programming a magnetic memory. FIG. 7B is a graph 180 depicting a write-read test using a conventional method for programming a magnetic memory. Referring to FIGS. 7A and 7B, the graph 170 indicates that all programming operations using a method in accordance with the present invention are successful. However, as can be seen in the graph 180, the low and high states are joined by some lines, indicating that some programming operations failed when conventional programming was used. Thus, using the methods 100, 110, 130, and/or 150 in accordance with the present invention, performance of a magnetic memory can be improved.

Figure 8:
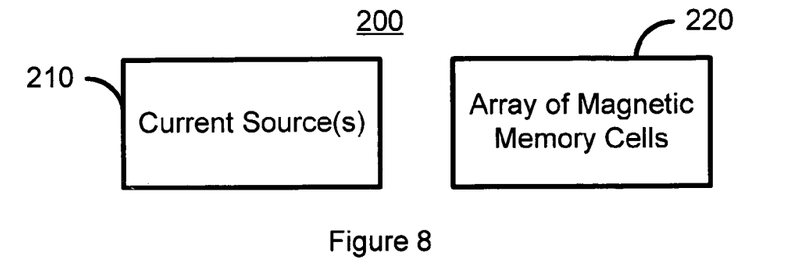
FIG. 8 is a high-level block diagram of one embodiment of a system in accordance with the present invention for programming a magnetic storage cell in a magnetic memory.

FIG. 8 is a high-level block diagram of one embodiment of a system 200 in accordance with the present invention for programming a magnetic storage cell in a magnetic memory. The system 200 includes current source(s) 210 and an array of memory cells 220. The methods 100, 110, 130, and/or 150 can be used to program cells in the magnetic memory. The array 220 includes magnetic storage cells that are preferably magnetic tunneling junctions, such as those depicted in FIG. 1A and corresponding to the free layers of FIGS. 2A–2C. The current source(s) 210 are used to provide the word line and bit line currents in the method 110, 110, 130, and/or 150. Thus, although a single connection to the array 220 is shown, the current source(s) 210 are typically connected via word lines and bit lines. In addition, in a preferred embodiment, the current source(s) include at least one source for providing the word line current and at least one separate source for providing the bit line current.

In operation, the current source(s) 210 provide the word line currents and bit line currents as described in the methods 100, 110, 130, or 150. Thus, the current source(s) 210 preferably turn on a word line current to selected word lines, turn on an appropriate bit line current for selected bit lines, and turn the currents off as described in the methods 100, 110, 130, and/or 150. Consequently, the system 200 can program memory cells of the array 220 more repeatably. Consequently, performance is improved.

A method and system has been disclosed for repeatably programming a magnetic memory. Software written according to the present invention is to be stored in some form of computer-readable medium, such as memory, CD-ROM or transmitted over a network, and executed by a processor. Consequently, a computer-readable medium is intended to include a computer readable signal which, for example, may be transmitted over a network. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for programming at least one magnetic memory cell comprising:

turning on a word line current for generating at least one hard axis field;

turning on a bit line current, the bit line current for generating at least one easy axis field the bit line current being turned on after the word line current is turned on; and turning off the word line current and the bit line current such that a state of the at least one magnetic memory cell is repeatably obtained and such that the bit line current reaches zero before the word line current.

2. A method for programming at least one magnetic memory cell comprising:
   turning on a word line current for generating at least one hard axis field;
   turning on a bit line current, the bit line current for generating at least one easy axis field, the bit line current turning on further including turning the bit line current on after the word line current is turned on; and
   turning off the word line current and the bit line current such that a state of the at least one magnetic memory cell is repeatably obtained wherein the turning off step further includes
   turning off the word line current and the bit line current such that the word line current reaches zero after the bit line current reaches zero.

3. A method for programming at least one magnetic memory cell comprising:
   turning on a word line current for generating at least one hard axis field;
   wherein word line current turning on step further includes:
   turning the word line current on to a first value;
   turning on a bit line current, the bit line current for generating at least one easy axis field, the bit line current turning on further including turning the bit line current on after the word line current is turned on; and
   turning off the word line current and the bit line current such that a state of the at least one magnetic memory cell is repeatably obtained and wherein the bit word line current and bit line current turning off step further includes
   turning the word line current to a second value less than the first value and greater than zero after the bit line current is turned on;
   turning the bit line current off while the word line current is at the second value; and
   turning the word line current off after the bit line current is turned off.

4. A method for programming at least one magnetic memory cell comprising:
   turning on a word line current for generating at least one hard axis field;
   turning on a bit line current, the bit line current for generating at least one easy axis field, the bit line current turning on further including turning the bit line current on after the word line current is turned on; and
   turning off the word line current and the bit line current such that a state of the at least one magnetic memory cell is repeatably obtained wherein turning off step further includes:
   gradually decreasing the word line such that the word line current reaches zero after the bit line current is zero.

5. A method for programming at least one magnetic memory cell comprising:
   turning on a word line current for generating at least one hard axis field;
   turning on a bit line current, the bit line current for generating at least one easy axis field, the bit line current turning on further including turning the bit line current on after the word line current is turned on; and
   turning off the word line current and the bit line current such that a state of the at least one magnetic memory cell is repeatably obtained wherein the turning off step further includes
   turning the bit line current off; and
   turning the word line current off after the bit line current has been turned off.

6. A magnetic memory comprising:
   a plurality of magnetic memory cells; and
   at least one current source for providing a word line current and a bit line current for programming at least one magnetic memory cell of the plurality of magnetic memory cells, the word line current for generating at least one hard axis field, the bit line current for generating at least one easy axis field, the at least one current source for turning on the word line current, for turning on a bit line current after the word line current is turned on, and for turning off the word line current and the bit line current such that a state of the at least one magnetic memory cell is repeatably obtained, the at least one current source also being configured for turning off the word line current and the bit line current such that the bit line current reaches zero before the word line current.

7. The magnetic memory of claim 6 wherein the at least one current source further turns the bit line current on after the word line current is turned on.

8. A magnetic memory comprising:
   a plurality of magnetic memory cells; and
   at least one current source for providing a word line current and a bit line current for programming at least one magnetic memory cell of the plurality of magnetic memory cells, the word line current for generating at least one hard axis field, the bit line current for generating at least one easy axis field, the at least one current source for turning on the word line current, for turning on a bit line current after the word line current is turned on, and for turning off the word line current and the bit line current such that a state of the at least one magnetic memory cell is repeatably obtained;
   wherein the at least one current source further turns the bit line current on after the word line current is turned on, and wherein the at least one current source further turns off the word line current and the bit line current such that the word line current reaches zero after the bit line current reaches zero.

9. A magnetic memory comprising:
   a plurality of magnetic memory cells; and
   at least one current source for providing a word line current and a bit line current for programming at least one magnetic memory cell of the plurality of magnetic memory cells, the word line current for generating at least one hard axis field, the bit line current for generating at least one easy axis field, the at least one current source for turning on the word line current, for turning on a bit line current after the word line current is turned on, and for turning off the word line current and the bit line current such that a state of the at least one magnetic memory cell is repeatably obtained;
   wherein the at least one current source further turns the bit line current on after the word line current is turned on, and wherein the at least one current source further turns the word line current and the bit line current off such that the at least one current source turns the word line current on to a first value, turns the word line current to a second value less than the first value and greater than zero after the bit line current is turned on, turns the bit line current off while the word line current is at the second value, and turns the word line current off after the bit line current is turned off.

10. A magnetic memory comprising:

a plurality of magnetic memory cells; and at least one current source for providing a word line current and a bit line current for programming at least one magnetic memory cell of the plurality of magnetic memory cells, the word line current for generating at least one hard axis field, the bit line current for generating at least one easy axis field, the at least one current source for turning on the word line current, for turning on a bit line current after the word line current is turned on, and for turning off the word line current and the bit line current such that a state of the at least one magnetic memory cell is repeatably obtained;

wherein the at least one current source further turns the bit line current on after the word line current is turned on, and wherein the at least one current source further turns the word line current and the bit line current off such that the at least one current source gradually decreases the word line such that the word line current reaches zero after the bit line current is zero.

11. A magnetic memory comprising:

a plurality of magnetic memory cells; and at least one current source for providing a word line current and a bit line current for programming at least one magnetic memory cell of the plurality of magnetic memory cells, the word line current for generating at least one hard axis field, the bit line current for generating at least one easy axis field, the at least one current source for turning on the word line current, for turning on a bit line current after the word line current is turned on, and for turning off the word line current and the bit line current such that a state of the at least one magnetic memory cell is repeatably obtained;

wherein the at least one current source further turns the bit line current on after the word line current is turned on, and wherein the at least one current source further turns the word line current and the bit line current off such that the at least one current source turns the bit line current off and then turns the word line current off after the bit line current has been turned off.

12. A method for programming at least one magnetic memory cell comprising:

(a) turning on a word line current for generating at least one hard axis field;

(b) turning on a bit line current after the word line current is turned on, the bit line current for generating at least one easy axis field; and (c) turning off the bit line current;

(c) turning off the word line current after the bit line current is turned off.

\* \* \* \* \*